United States Patent
Asahi et al.

[11] Patent Number: 5,871,580
[45] Date of Patent: Feb. 16, 1999

[54] METHOD OF GROWING A BULK CRYSTAL

[75] Inventors: Toshiaki Asahi; Osamu Oda; Kenji Sato, all of Toda, Japan

[73] Assignee: Japan Energy Corporation, Tokyo, Japan

[21] Appl. No.: 669,493
[22] PCT Filed: Apr. 10, 1995
[86] PCT No.: PCT/JP95/02025
§ 371 Date: Jul. 11, 1996
§ 102(e) Date: Jul. 11, 1996
[87] PCT Pub. No.: WO96/15297
PCT Pub. Date: May 23, 1996

[30] Foreign Application Priority Data

Nov. 11, 1994 [JP] Japan .................................. 6-278015

[51] Int. Cl.⁶ .................................................. C30B 28/04
[52] U.S. Cl. ................................ 117/83; 117/54; 117/81
[58] Field of Search .............................. 117/54, 57, 61, 117/81, 82, 83

[56] References Cited

U.S. PATENT DOCUMENTS

| | | | |
|---|---|---|---|
| 4,289,570 | 9/1981 | Terkelsen | 164/122.1 |
| 4,869,776 | 9/1989 | Kitagawa et al. | 117/3 |
| 5,174,854 | 12/1992 | Sano et al. | 117/83 |
| 5,499,600 | 3/1996 | Okuno et al. | 117/68 |

FOREIGN PATENT DOCUMENTS

| | | |
|---|---|---|
| 58-69800 | 4/1983 | Japan . |
| 63-35349 | 7/1988 | Japan . |
| 1-122998 | 5/1989 | Japan . |
| 3-40987 | 2/1991 | Japan . |
| 5-279165 | 10/1993 | Japan . |
| 5-310494 | 11/1993 | Japan . |
| 7-206597 | 8/1995 | Japan . |

*Primary Examiner*—Felisa Garrett
*Attorney, Agent, or Firm*—Birch, Stewart, Kolasch & Birch, LLP

[57] ABSTRACT

Using a thin plate seed crystal 10 having a different material from a bulk crystal to be grown and having a great diameter, before crystal growth is started, a temperature in the lower portion of a solution 12s in which material is solved into a solvent (or a melt 12m) is set to a higher temperature than the upper portion to cause convection so that the surface of seed crystal 10 is rinsed by the convection by keeping in the state for a predetermined period. Then, the crystal growth is started by the Bridgman method or gradient freezing method. In this case, a temperature gradient may be provided on the surface of seed crystal 10 by inclining the seed crystal 10 such that nucleation of crystal growth is generated at a position whose temperature is lowest on the surface of seed crystal 10 upon the start of crystal growth, or a small concave or protrusion portion may be formed in advance on the surface of seed crystal 10 such that nucleation of crystal growth is generated at the small concave or protrusion portion. Thereby, a bulk single crystal of good quality can be manufactured with a high yield.

19 Claims, 2 Drawing Sheets

METHOD OF GROWING A BULK CRYSTAL

TECHNICAL FIELD

The present invention relates to a method of growing a bulk crystal, and more specifically, to a useful technique applied to manufacturing a compound semiconductor single crystal from melt or solution by use of a large diameter seed crystal.

BACKGROUND OF THE INVENTION

Conventionally, as a method of growing a compound semiconductor bulk single crystal are known the vertical Bridgman (VB) method in which a growth vessel (crucible) filled with a melt is gradually moved to grow a crystal in an upward or downward direction in relation to a heating furnace having a temperature gradient or a vertical gradient freezing (VGF) method in which a vertical temperature gradient is provided in a melt and the melt is gradually cooled to grow a crystal.

In the VB method and VGF method, a crucible is typically used in which the bottom of the crucible is inclined down toward the center of the bottom. A bulk single crystal is obtained by locating a seed crystal having the same composition as the crystal to be grown and having a diameter considerably smaller than the crystal to be grown, on the center of the bottom of the crucible, to solidify a melt; or by naturally generating a nucleus at the center of the bottom of the crucible without using the seed crystal to solidify the melt.

As a growth method of a compound semiconductor bulk crystal, a liquid encapsulated Czochralski (LEC) method is known in which a melt is covered by encapsulating material such as $B_2O_3$ in the crucible and the seed crystal is brought into contact with the surface of the melt to grow a crystal by gradually pulling up the seed crystal. This method is widely used. The seed crystal used in this method also has the same material as the crystal to be grown and a considerably smaller diameter than it, like the above-mentioned VB method and VGF method.

However, since in the II–VI group compound semiconductor such as CdTe, thermal conductivity is low and shearing stress is small, there is a problem in that a single crystal of good quality cannot be obtained with a high yield in the above-mentioned conventional VB method, VGF method and LEC method. Further, there is also another problem in the conventional VB method and VGF method. Nucleation of polycrystal growth is generated during the growth of crystal shoulder portion corresponding from the center of the bottom of the crucible to a straight portion of the crucible. In addition, since the shoulder portion must be formed in the conventional VB method, VGF method and LEC method, there is another problem in that the straight portion is short so that the number of wafers cut out from the crystal decreases.

In the VB method, VGF method and LEC method, a method is proposed in which a crystal having shorter shoulder portion is grown by using a seed crystal having a diameter greater than that of the conventional methods. However, since the shoulder portion cannot be completely removed, the portion is not yet solved, i.e., nucleation of polycrystal growth is generated during the growth of shoulder, as described above.

Further, because the seed crystal is the same material as the crystal to be grown, there is another problem in that it is very difficult to control the amount of the seed crystal molten by the melt within a predetermined level, wherein a portion of the seed crystal in contact with the melt is molten upon seeding.

The seed crystal which is the same material as the crystal to be grown is typically used but there is a case that the seed crystal which is a different material is used in a special example. For instance, when there is no suitable GaP seed crystal to grow a GaP single crystal, the GaP single crystal is first grown by the LEC method using an InAs single crystal as the seed crystal and then a GaP seed crystal is cut out from the obtained crystal ingot to use in the subsequent manufacture of a GaP single crystal. In this method, however, there is a problem in that a single crystal to be obtained (GaP in the above example) cannot be directly obtained from the seed crystal having the different material (InAs in the above example) and the material of the seed crystal which is the different composition dissolves in the material melt so that a crystal having a different composition is grown.

In the liquid phase epitaxy (LPE) method, there is an example in which a CdTe single crystal film is grown on a sapphire substrate (aluminum oxide: $Al_2O_3$). However, a thin film of CdTe crystal is only obtained and a bulk crystal cannot be obtained.

Alternatively, there is a method in which a bulk crystal is grown on the sapphire substrate by a vapor phase epitaxy method. In the method, however, there is a problem in that the growth rate is very slow and a large size of crystal cannot be grown.

As described above, in the conventional VB method, VGF method and LEC method, or a method using a large diameter of seed crystal in these methods, a bulk single crystal of good quality cannot be obtained with a high yield.

The present invention is accomplished in the light of above circumstances. The object of this invention is to provide a method of growing a bulk single crystal of good quality with a high yield.

SUMMARY OF THE INVENTION

For achieving the above object, the inventors considered that it is effective to use as a seed crystal a single crystal substrate having a different material from that of a bulk crystal to be grown. As a result of study, the inventors succeeded in growing a bulk single crystal of good quality.

The present invention provides a method of growing a bulk crystal from a melt or a solution, the method comprising: making a seed crystal in contact with a melt or solution containing component elements of the bulk crystal; and growing the bulk crystal from the seed crystal; wherein the seed crystal is a thin plate single crystal having a melting point higher than a growth temperature and comprises a different material from the bulk crystal and has a small solubility to the melt or the solution.

A single crystal of CdTe, ZnTe or ZnSe with a good quality which could not be conventionally obtained with high yield, can be easily grown and a single crystal of good quality can be obtained with high yield in comparison with the conventional methods. Further, since the seed crystal does not melt at the temperature of crystal growth, it becomes easy to control a temperature upon seeding. Because the thermal conductivity of the seed crystal becomes high, heat condition through the seed crystal increases and the crystal growth rate can be increased. Thus, the present invention is extremely effective in industrial production.

In the present invention, the seed crystal may be located in a bottom of a crucible, or at an end of a boat. Also, the seed crystal may be placed in contact with a surface of the melt or solution.

The bulk crystal may be grown by methods such as a gradient freezing (GF) method, a Czochralski method, a liquid encapsulated Czochralski (LEC) method, and a Bridgman method.

The seed crystal may have substantially the same diameter as the bulk crystal to be grown.

A vapor pressure of volatile component elements during the crystal growth may be controlled in an ampoule.

After the seed crystal is placed in contact with the melt or the solution at a solid-liquid interface and before the crystal growth is started, a power supplied to a furnace may be adjusted such that a temperature on the seed crystal side in the melt or solution is higher than that on the other side and the melt or solution may be kept in this state for a predetermined period.

In this manner, convection is caused in the melt in the melt or solution in the crucible and the surface of the seed crystal contacting the melt or solution is rinsed such that adhesive particles which act as nucleation center of polycrystal growth are removed from the surface. Therefore, nucleation of polycrystal growth can be prevented and a single bulk crystal of good quality can be obtained with a high yield.

Further, a temperature gradient may be provided in a solid-liquid interface between the seed crystal and the melt or the solution at least during the crystal growth such that a position whose temperature is lower than other positions in the interface is caused. More particularly, the solid-liquid interface is desirably inclined such that a normal line of the solid-liquid interface between the seed crystal and the melt or the solution is inclined to the direction of the crystal growth. Alternatively, by forming a surface of the seed crystal contacting the melt or the solution in a cone-shaped depression (that is, so as to become gradually lower from the peripheral portion of the surface toward the center of the surface), the above-mentioned temperature gradient may be provided.

By providing a lower temperature position in the solid-liquid interface, or a one small concave or protrusion portion in the seed crystal at which nucleation of crystal growth is generated, nucleation of polycrystal growth can be prevented and a single bulk crystal can be obtained with a high yield.

The bulk crystal to be grown is a compound semiconductor single crystal. For instance, CdTe, ZnTe or ZnSe can be selected as the compound semiconductor. Further, the seed crystal is a single crystal of oxide and, for instance, sapphire (aluminum oxide: $Al_2O_3$) can be selected as the oxide.

BEST MODE OF THE INVENTION

The first embodiment for a method of growing a bulk crystal according to the present invention will be described.

Figure 1:
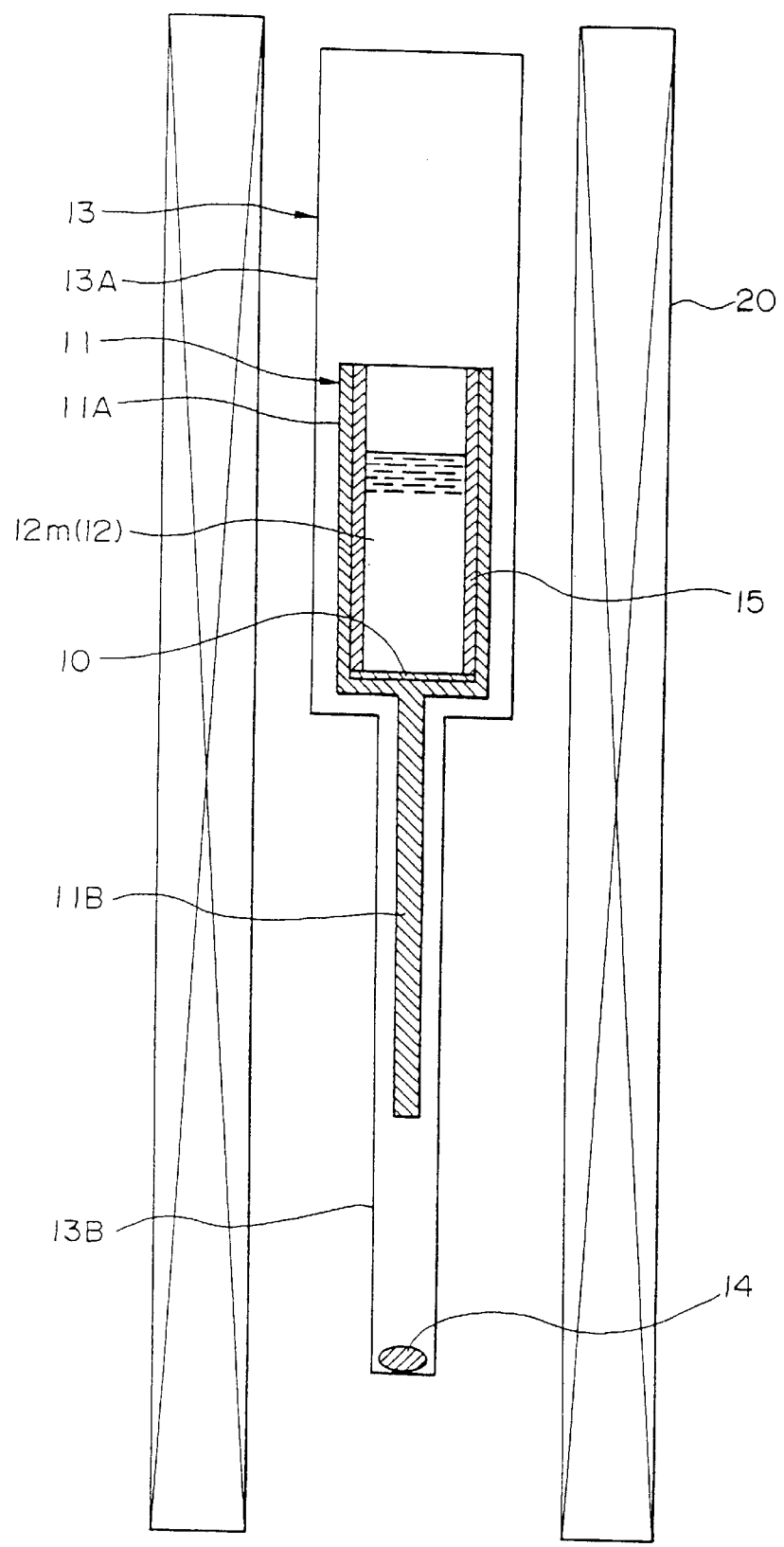
FIG. 1 is a schematic diagram for showing the first embodiment of a method of growing a bulk crystal according to the present invention.

In FIG. 1, an example is shown in which the method of growing a bulk crystal according to the present invention is applied to the vertical gradient freezing (VGF) method. As shown in FIG. 1, in the growth method, material 12 is put in a crucible 11 in whose bottom a seed crystal 10 of a thin plate having different components from a bulk crystal to be grown is located. The crucible 11 is located in a growth chamber 13A of an ampoule 13 and the ampoule 13 is sealed in vacuum. The sealed ampoule 13 is positioned in a furnace to melt the material 12. A temperature gradient is provided in the melt 12m so that a temperature at the upper side of the crucible is higher than that of the bottom of the crucible. The material melt is gradually cooled while keeping the temperature gradient so that the material melt is solidified from the seed crystal 10 side to the upper side to grow a bulk crystal.

A reservoir section 13B is provided in the lower portion of the ampoule 13 to communicate with the growth chamber 13A. Simple substance (or it may be compound) 14 composed of volatile component elements of a single bulk crystal to be grown is located in the reservoir 13B to control vapor pressure of the volatile elements.

The seed crystal 10 is a single crystal which has a melting point higher than the growth temperature of the bulk crystal to be grown and which does not melt when the seed crystal contacts the melt 12m. More particularly, the seed crystal is desirably sapphire (aluminum oxide $Al_2O_3$). Alternatively, it may be a single crystal of compound semiconductor.

The area of seed crystal 10 contacting the melt 12m is desirably 1 $cm^2$ or more, although being not limited to the value. The reason is that productivity becomes wrong if the area of seed crystal 10 is less than 1 $cm^2$. It is more preferable that the seed crystal 10 has a size fit for the bottom of the crucible body 11A in which the melt 12m is filled. In this case, the shape of the bottom of the crucible body 11A may be flat and therefore the shape of the crucible 11 can be simplified.

The thickness of the seed crystal 10 is not specifically limited but may be thin because the seed crystal has the melting point higher than the crystal growth temperature and does not melt during the crystal growth. In this case, the thickness is desirably 5 mm or less and more desirably 1 mm or less. The reason is that the cost only becomes higher if the thickness increases. Further, in order to radiate the heat of the melt 12m while keeping good thermal conductivity, the thickness is preferably 5 mm or less and more preferably 1 mm or less. By effectively radiating the heat of the melt 12m through the thin seed crystal 10, the growth rate can be increased, resulting in an increase of productivity.

Note that by fitting a cylindrical pressing member 15 in the crucible body 11A, the seed crystal 10 is fixed not to float up in the melt 12m.

Further, in the example shown in FIG. 1, the crucible 11 has a heat sink 11B for heat radiation which extends downward from the bottom plate of the crucible body 11A. By the heat sink 11B, the heat transferred from the melt 12m through the seed crystal 10 can be effectively radiated, resulting in further increasing the productivity.

Note that the furnace is arranged to surround the ampoule 13 and has a cylindrical heater such as a multi-stage heater 20 by which a temperature distribution can be adjusted in the vertical direction. Thus, by adjusting the power, a desired temperature distribution can be obtained. Therefore, the temperature gradient in the melt 12m can be set such that the upper portion is higher in temperature and the volatile element 14 in the reservoir 13B can be heated up to such a temperature that the desired pressure of the element is applied in the ampoule 13.

According to the above-mentioned first embodiment, by growing a bulk crystal using the seed crystal 10 of a thin plate having a large diameter and made of a different material from that of the bulk crystal to be grown, a single bulk crystal of CdTe, ZnTe, ZnSe or the like with a good quality which could not be conventionally obtained with high yield, can be easily grown and a single crystal of good quality can be obtained with a higher yield (of about 5 to 10%) in comparison with the conventional methods. Further, since the seed crystal does not melt at the crystal growth temperature, the temperature control upon seeding is easy. The seed crystal 10 is a thin plate type. Therefore, the thermal conductivity is high such that heat is easy to be released through the seed crystal 10, so that the crystal growth rate can be increased. The present invention is extremely effective in industrial production.

Next, the second embodiment for the method of growing a bulk crystal according to the present invention will be described.

Figure 2:
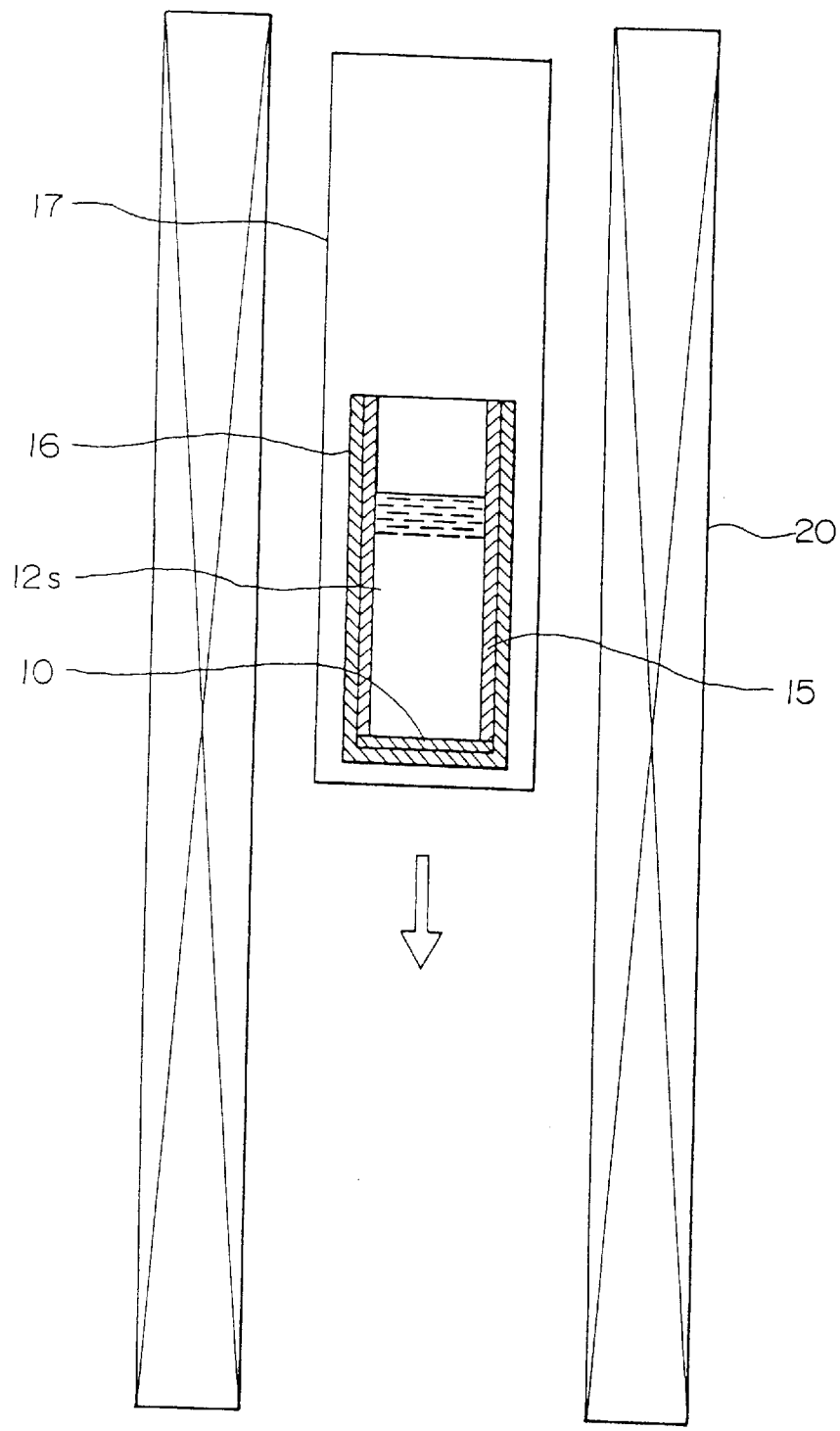
FIG. 2 is a schematic diagram for showing the second embodiment of a method of growing a bulk crystal according to the present invention.

In FIG. 2, an example in which the method of growing a bulk crystal according to the present invention as applied to the vertical Bridgman (VB) method is shown. As shown in FIG. 2, in the growth method, compound semiconductor material and solvent for solving the material are put in a crucible 16 in whose bottom a seed crystal 10 of a thin plate having different components from a bulk crystal to be grown is located by a pressing member 15. The crucible 16 is located in an ampoule 17 and the ampoule 13 is sealed in a vacuum. The sealed ampoule 13 is positioned in a furnace to heat by a heater 20. If the compound semiconductor material dissolves in the solvent to produce a solution 12s, a bulk crystal is gradually grown from the seed crystal 10 side toward the upper portion of the solution 12s by moving the ampoule 17 from a high temperature side to a low temperature side (from the upper portion to the lower portion in the figure) in the furnace having a predetermined temperature distribution accomplished by adjusting the power supplied to the heater 20.

Note that the same components as in the first embodiment are assigned with the same reference numerals and the description will be omitted.

The seed crystal 10 is a single crystal which has a melting point higher than the growth temperature of the bulk crystal to be grown and which does not melt or dissolve in the solution 12s and is an oxide single crystal of sapphire (aluminum oxide: $Al_2O_3$) or a single crystal of compound semiconductor. The size and thickness of the seed crystal 10 are the same as described in the first embodiment and therefore the description will be omitted.

According to the above-mentioned second embodiment, by growing a crystal using the seed crystal 10 of a thin plate having a large diameter and made of a different material from that of the bulk crystal to be grown, a single bulk crystal of CdTe, ZnTe, ZnSe or the like with a good quality can be easily grown and a single bulk crystal of good quality can be obtained with a higher yield (of about 5 to 10%) in comparison with the conventional methods, as in the first embodiment. Further, since the bulk crystal growth rate can be increased, the present invention is extremely effective in industrial production.

The inventors guess the reason why the yield is as much as 5 to 10% in the first and second embodiments as follows. Since the bulk crystal and the seed crystal 10 are made of the different material and have different lattice constants and the different crystal structures, it is considered that a growing orientation cannot be determined a specific orientation. It also considered that a lot of nucleation occur at the same time and upon the start of crystal growth because the contact surface of the seed crystal 10 with the melt 12m or solution 12s is contaminated by a plurality of adhesive particles. Twin crystals and polycrystals are grown because of different growth orientations of the crystals generated from the above nucleation. In a case where the crystal grown becomes a single crystal, it can be considered that the nucleation generates at a single position of the surface of seed crystal 10 or the nucleation generates at a plurality of positions on the surface of the seed crystal 10 but the orientation of the crystals is the same.

Next, the third embodiment for the method of growing a bulk crystal according to the present invention will be described.

In the third embodiment, after the melt 12m or the solution 12s is produced in the crucible 11, 16 by the heater 20, and before the start of the crystal growth, the temperature of the lower portion of the melt 12m or the solution 12s (the seed crystal 10 side in FIGS. 1 and 2) is set to a temperature higher than the upper portion such that convection is caused, and the adhesive particles on the surface of the seed crystal 10 are rinsed by the convection while keeping the state for a predetermined time, in the first and second embodiments. After the rinse process with the convection, a temperature profile is accomplished by the heater 20 such that the temperature on the seed crystal 10 side in the melt 12m or the solution 12s becomes lower than that of other side. The cooling is gradually executed such that the crystal is deposited from the interface between the seed crystal 10 and the melt 12m or the solution 12s while gradually decreasing the supplied power to the furnace with an almost constant temperature gradient (the gradient freezing method), or the ampoule 13 and 17 are gradually moved toward the lower temperature portion in the furnace (the Bridgman method) such that the crystal is deposited from the interface, as in the first and second embodiments.

According to the above-mentioned third embodiment, since the crystal growth is started after the surface of seed crystal 10 is rinsed by the convection generated by setting the temperature of the lower portion of the melt 12m or solution 12s to a higher temperature than the upper portion, a single crystal of CdTe, ZnTe, ZnSe or the like can be obtained in good quality with yield as much as 50 to 60%.

The inventors guess the reason why the yield becomes higher by as much as 50 to 60% as follows. Since the bulk crystal and the seed crystal 10 are made of the different material and have different lattice crystal structures, it is considered that the growing orientation cannot be determined a specific orientation. Actually, in forming a thin film crystal, it is reported that it is difficult to control the growth plane orientation in a case that a substrate made of a different material from the growing crystal is used, because the growing orientation strongly depends upon the growth condition. Specifically, in a case that a crystal having strong ionic bonding is grown, the growing orientation is not always determined. Further, when bulk crystals containing twin crystal or polycrystal are observed, it was found that most of the twin crystal and polycrystal are generated at the center portion of the seed crystal substrate. From the above-mentioned matters, it is considered that nucleation generates in the initial state of crystal growth at the same time and at many positions of the center portion of the substrate where the temperature is low and the growing orientations are different. In a case where a single crystal is grown, it can be considered that the nucleation generates at a single position of the surface of seed crystal 10 or the nucleation generates at a plurality of positions on the surface of the seed crystal 10 but the orientations are all the same.

From the above considerations, it is understood that it would be possible to grow a single crystal with high yield if the nucleation can be controlled to generate at a single position on the surface of the seed crystal 10 in the initial stage of crystal growth.

Next, the fourth embodiment for the method of growing a bulk crystal according to the present invention will be described.

In the fourth embodiment, a position where nucleation of crystal growth is easily generated at the start of crystal growth is provided in advance on the surface of the seed crystal 10, in the first, second and third embodiments. That is, by providing the heater 20 and further a sub-heater, if necessary, a temperature gradient is formed on the surface of the seed crystal 10 such that a nucleus is created at the lowest temperature position on the surface. A normal line on the surface of the seed crystal 10 may be inclined to the direction of the center axis of the heater 20 for forming a temperature gradient on the surface of the seed crystal 10 such that a nucleus is created at the lowest temperature position on the surface. Alternatively, at least one (preferably, one) small concave portion or protrusion portion may be formed on the surface of the seed crystal 10 so that the nucleus is created at the small convex portion or the small protrusion portion. In addition, the seed crystal 10 may be formed to have a cone-shaped depression so that the nucleus is created at the bottom.

According to the above-described fourth embodiment, since the position where the nucleation of crystal growth is easily generated is provided, the nucleation of crystal growth is generated preferentially at the portion on the initial time of the growth while preventing a lot of the nucleation at the same time. Therefore, a single crystal of CdTe, ZnTe, ZnSe or the like can be obtained in good quality with yield of as much as 70 to 80%.

Note that although the examples in which the present invention is applied to the VGF method and VB method were described in the above embodiments, the present invention is not limited to these. The present invention is applicable to crystal growing methods such as a horizontal Bridgman (HB) method, horizontal gradient freezing (HGF) method, and Czochralski method, liquid encapsulated Czochralski (LEC) method. In the case of the LEC method, a seed crystal 10 is made to be in contact with the surface of melt 12*m* covered by encapsulating material such as $B_2O_3$ and is gradually arisen while being rotating.

Further, in each of the above embodiments, the seed crystal 10 is located on the lower side than the melt 12*m* or solution 12*s*. However, the seed crystal 10 may be made in contact with the upper surface of the melt 12*m* or solution 12*s* such that the melt 12*m* or solution 12*s* is solidified downward to grow a crystal.

In addition, the seed crystal 10 is not limited to sapphire (aluminum oxide: $Al_2O_3$) and may be selected properly taking account for growth temperature, lattice constant and thermal expansion coefficient of the bulk crystal to be grown. Note that although it is preferable that the lattice constant of the seed crystal 10 is matched to that of the bulk crystal to be grown, the crystal growth is possible even if the lattice matching is not always accomplished. In a case where the crystal growth is executed using the solution in which compound semiconductor material is dissolved in a solvent, a seed crystal made of a substance having a lower melting point can be selected because the growth temperature is low, in comparison with the case where the crystal growth is executed using a melt obtained by melting polycrystal material.

Specific examples of crystal growth to which the present invention is applied will be described below but the present invention is not limited to the specific examples.

(EMBODIMENT 1)

A single crystal of CdTe was grown by the VGF method using the furnace shown in FIG. 1. The thin plate seed crystal 10 made from sapphire (aluminum oxide: $Al_2O_3$) having a plane orientation of (0001) and having the thickness less than 5 mm (sapphire substrate) was located at the bottom of crucible 11 made of carbon and fixed by a pressing member 15 made of carbon. The sapphire substrate was subjected to mirror polishing in advance such that there was no small protrusion or convection portion on the surface. The length from the bottom to the top of the crucible body 11A was 100 mm and the inner diameter of the pressing member 15, namely, the diameter of crystal to be grown was 50 mm.

CdTe polycrystaline material 12 of 570 g was provided in the crucible 11. After the crucible was located in the growth chamber 13A of the ampoule 13 and Cd 14 of the sufficient amount to control vapor pressure was provided in the reservoir 13B, the ampoule 13 was sealed in a vacuum state.

The ampoule 13 was located in the furnace for VGF. The material 12 was heated to a temperature close to the melting point by the multi-stage heater 20 of the furnace to set the temperature gradient of 2° C./cm in the vertical direction of the ampoule 13 such that the seed crystal 10 side is at lower temperature. The material 12 was further heated to melt and obtain the melt 12*m*. At that time, the height of the melt 12*m* was 50 mm. However, the seed crystal 10 (sapphire substrate) did not quite melt. The temperature of the reservoir 13B was kept in such a manner that a desired Cd pressure could be applied to the inside of ampoule 13.

Next, the melt 12*m* was gradually cooled at a temperature decreasing rate of 0.1° C./hour while keeping the above temperature gradient so that the melt 12*m* was solidified from the seed crystal 10 side toward the upper portion to obtain the bulk crystal. In this case, the fluctuation of temperature was ±0.1° C. Observing the obtained crystal, the CdTe single crystal was inclined by 10° to 15° from the (111) plane. When the crystal growth was performed a plurality of times with the above-mentioned condition and procedure, the yield of the single crystal was as much as 5 to 10%.

(EMBODIMENT 2)

A single crystal of ZnTe was grown by the VB method using Te as solvent and the furnace shown in FIG. 2.

The seed crystal 10 made from sapphire (aluminum oxide: $Al_2O_3$) having a plane orientation of (0001) and having the thickness less than 5 mm (sapphire substrate) was located at the bottom of crucible 16 made of graphite, and fixed by a pressing member 15. The sapphire substrate was subjected to mirror polishing in advance such that there was no small protrusion or convection portion on the surface. The length from the bottom to the top of the crucible 16 was 100 mm and the inner diameter of the pressing member 15, namely, the diameter of crystal to be grown was 1 inch. Te of 60 gas solvent and ZnTe polycrystaline material of 70 g as solute (the amount was sufficiently soluble in the Te solvent of 60 g at the crystal growth temperature 1100° °C.) was filled in the crucible 16. The crucible was put in the quartz ampoule 17 and the ampoule was sealed in the vacuum of $2 \times 10^{-6}$ Torr.

The ampoule 17 was located in the furnace such that the center axis of the crucible 16 was coincident with that of the furnace. Subsequently, by the heater 20, a temperature gradient was provided such that the temperature was 1165° C. at the bottom of crucible 16 and the temperature was 1150° C. at the top surface of the solution 12S which was produced by dissolving the solute in the solvent (the top surface was 70 mm in height from the bottom of crucible). The solute was dissolved sufficiently by keeping this state for two days. Thus, by setting the temperature of the bottom of the crucible to a temperature higher than that of the top surface of the solution 12s, convection was caused at the same time when the solute dissolved into the solvent. The solving of the solute was promoted and the surface of the seed crystal 10 was rinsed by the convection to have a clean surface.

Thereafter, a temperature distribution in the furnace was changed by the heater 20 such that the temperature was decreased toward the lower portion of the furnace with the temperature gradient of 15° C./cm. The ampoule 17 was moved toward the lower temperature side at the speed of 3 cm/day to grow the bulk crystal. Observing the obtained crystal, the ZnTe single crystal of 15 mm in long was obtained. When the crystal growth was repeated in the same manner, the yield of the single crystal was as much as 50 to 60%.

(EMBODIMENT 3)

A single crystal of ZnTe was grown by the VB method using Te as solvent and the furnace shown in FIG. 2.

The seed crystal 10 made from sapphire, having a plane orientation of (0001) and having the thickness less than 5 mm (sapphire substrate) was located at the bottom of crucible 16 made of graphite, and fixed by a pressing member 15. The sapphire substrate was subjected to mirror polishing in advance. The crucible was made such that a bottom plate section inclined by 5° with respect to the vertical direction of the center axis of the crucible (that is, in the horizontal direction in FIG. 2). Thereby, the seed crystal 10 is mounted to the bottom of crucible in the state in which the surface was inclined by 5° from the horizontal direction. The length from the bottom to the top of the crucible 16 was 100 mm and the inner diameter of the pressing member 15 was 1 inch. Te of 60 g as solvent and ZnTe polycrystaline material of 70 g as solute was filled in the crucible 16. The crucible was put in the quartz ampoule 17 and the ampoule was sealed in the vacuum of $2 \times 10^{-6}$ Torr.

The ampoule 17 was located in the furnace such that the center axis of the crucible 16 was coincident with that of the furnace. Subsequently, by the heater 20, a temperature gradient was provided such that the temperature was 1165° C. at the bottom of crucible and the temperature was 1150° C. at the top surface of the solution 12s which was produced by solving the solute in the solvent (the top surface was 70 mm in height from the bottom of crucible). The solute was solved sufficiently by keeping this state for two days and the surface of seed crystal 10 was rinsed by the convection.

Thereafter, a temperature distribution in the furnace was changed by the heater 20 such that the temperature was decreased toward the lower portion of the furnace with the temperature gradient of 15° C./cm. The ampoule 17 was moved toward the lower temperature side at the speed of 3 cm/day to grow the crystal. ZnTe crystal was deposited from the position where the temperature was lowest on the surface of the seed crystal 10, that is, from the lowest position of the seed crystal 10. Observing the obtained crystal, the ZnTe single crystal was of 15 mm in long. When the crystal growth was repeated in the same manner, the yield of the single crystal was as much as 70 to 80%.

(EMBODIMENT 4)

A single crystal of ZnTe was grown by the VB method using Te as solvent and the heating furnace shown in FIG. 2.

The seed crystal 10 made from sapphire having a plane orientation of (0001) and having the thickness less than 5 mm (sapphire substrate) was located at the bottom of crucible 16 made of graphite, and fixed by the pressing member 15. The sapphire substrate was subjected to mirror polishing in advance and was formed with a concave portion (recession section) being 60 $\mu$m in diameter and 1 $\mu$m in deep at the substrate portion by oxygen ions in a super high vacuum state. The length from the bottom to the top of the crucible 16 was 100 mm and the inner diameter of the pressing member 15 was 1 inch. Te of 60 g as solvent and ZnTe polycrystaline material of 70 g as solute was filled in the crucible 16. The crucible was put in the quartz ampoule 17 and the ampoule was sealed in the vacuum of $2 \times 10^{-6}$ Torr.

The ampoule 17 was located in the furnace such that the center axis of the crucible 16 was coincident with that of the furnace. Subsequently, by the heater 20, the temperature gradient was provided such that the temperature was 1165° C. at the bottom of crucible and the temperature was 1150° C. at the top surface of the solution 12s which was produced by dissolving the solute in the solvent (the top surface was 70 mm in height from the bottom of crucible). The solute was dissolved sufficiently by keeping this state for two days and the surface of seed crystal 10 was rinsed by the convection.

Thereafter, a temperature distribution in the furnace was changed by the heater 20 such that the temperature was decreased toward the lower portion of the furnace with the temperature gradient of 15° C./cm. The ampoule 17 was moved toward the lower temperature side at the speed of 3 cm/day to grow the crystal. The nucleation of crystal growth is generated at the recession section of the surface of seed crystal 10 and the ZnTe crystal was grown. Observing the obtained crystal, the ZnTe single crystal was of 15 mm in length. When the crystal growth was repeated in the same manner, the yield of the single crystal was as much as 70 to 80%.

Note that although the examples of growing a single crystal such as CdTe and ZnTe were described in the above embodiments, the present invention is not limited to this. The present invention is applicable to growth of other bulk crystals such as II–VI group compound semiconductor of ZnSe or the like, III–V group compound semiconductor, and Si single crystal.

Industrial Applicability

As described above, according to the method of growing a bulk crystal of the present invention, since crystal growth is performed by use of a single crystal substrate of thin plate having a melting point higher than the bulk crystal to be grown and having a different material from the bulk crystal to be grown as a seed crystal, the single crystal of good quality can be obtained with a high yield. Further, since it becomes easy to control temperature upon seeding and the crystal growth rate can become high, the present invention is extremely effective in industrial production. In addition, by setting the high temperature at the crucible bottom before starting crystal growth so that convection is caused and the surface of seed crystal is rinsed by the convection, which prevents nucleation of polycrystal growth caused by the surface contamination, resulting in increasing the yield of single crystal. Furthermore, by providing a lower temperature position or a small convex or protrusion portion on the surface of the seed crystal to have a position in which nucleation of crystal growth is easily generated, nucleation of polycrystal growth is prevented, so that the yield of single crystal is further increased.

We claim:

1. A method of growing a bulk crystal grown from a melt or a solution, the method comprising: making a seed crystal in contact with the melt or the solution containing component elements of the bulk crystal; and growing the bulk crystal from the seed crystal; wherein the seed crystal is a thin plate single crystal having a melting point higher than a growth temperature and comprises a different material from the bulk crystal and has a small solubility to the melt or the solution.

2. The method of growing a bulk crystal according to claim 1, characterized in that the seed crystal is located in a bottom of a crucible in which the melt or the solution is filled.

3. The method of growing a bulk crystal according to claim 1, characterized in that the seed crystal is located at an end of a boat in which the melt or the solution is filled.

4. The method of growing a bulk crystal according to claim 1, characterized in that the seed crystal is made to contact a surface of the melt or the solution.

5. The method of growing a bulk crystal according to claim 1, characterized in that a temperature gradient is provided in the melt or the solution by control of power supplied to a furnace such that a temperature is low at a solid-liquid interface between the seed crystal and the melt or the solution, and that the crystal is grown at the solid-liquid interface as a supply power to the heating furnace is decreased to gradually cool while keeping the temperature gradient.

6. The method of growing a bulk crystal according to claim 1, characterized in that a temperature gradient is provided by control of power supplied to a furnace such that a temperature is increased from a solid-liquid interface between the seed crystal and the melt or the solution toward an interface side opposing the solid-liquid interface, and that the bulk crystal is grown at the solid-liquid interface by moving the seed crystal and the melt or the solution relative to the furnace toward a lower temperature side in the state in which the seed crystal is made in contact with the melt or the solution.

7. The method of growing a bulk crystal according to claim 1, characterized in that the crystal is grown by gradually pulling up the seed crystal.

8. The method of growing a bulk crystal according to claim 1, characterized in that the seed crystal has the same as or slightly smaller diameter than the bulk crystal to be grown.

9. The method of growing a bulk crystal according to claim 1, characterized in that a simple substance or compound made of a volatile element for vapor pressure control which is a component element of the melt or the solution is used, wherein the seed crystal or the crystal to be grown is sealed in a vacuum in an ampoule having a reservoir for vapor pressure control in an evacuated state, and that the crystal is grown while heating the reservoir such that a pressure under which volatile elements are hard to volatilize from the surface of a melt or of a solution is applied to the inside of the ampoule.

10. The method of growing a bulk crystal according to claim 1, characterized in that after the seed crystal is brought in contact with the melt or the solution at a solid-liquid interface and before the crystal growth is started, a temperature gradient is provided in the melt or the solution so that a temperature on the seed crystal side is higher than that of the melt or the solution side by adjusting a power supplied to the furnace and that the melt or the solution is kept in the state for a time enough to remove foreign substances from the surface of the seed crystal.

11. The method of growing a bulk crystal according to claim 1, characterized in that a temperature gradient is provided in a solid-liquid interface between the seed crystal and the melt or the solution at least during the crystal growth such that a position whose temperature is lower than that of other positions in the interface exists.

12. The method of growing a bulk crystal according to claim 11, characterized in that the bulk crystal is grown in a state in which the solid-liquid interface is inclined such that the direction of a normal line of the solid-liquid interface between the seed crystal and the melt or the solution is inclined to the direction of the crystal growth.

13. The method of growing a bulk crystal according to claim 11, characterized in that a surface of the seed crystal which is brought in contact with the melt or the solution is formed in a cone-shaped depression.

14. The method of growing a bulk crystal according to claim 1, characterized in that at least one small concave portion which acts as a nucleation center of the crystal growth is formed on the surface which is brought in contact with the melt or the solution of the seed crystal.

15. The method of growing a bulk crystal according to claim 1, characterized in that at least one small protrusion portion which acts as a nucleation center of the crystal growth is formed on the surface which is brought in contact with the melt or the solution of the seed crystal.

16. The method of growing a bulk crystal according to claim 1, characterized in that the crystal to be grown is a single crystal of compound semiconductor.

17. The method of growing a bulk crystal according to claim 16, characterized in that the compound semiconductor is CdTe, ZnTe or ZnSe.

18. The method of growing a bulk crystal according to claim 1, characterized in that the seed crystal is a single crystal of oxide.

19. The method of growing a bulk crystal according to claim 18, characterized in that the oxide is sapphire.

* * * * *